(12) United States Patent
Hioki et al.

(10) Patent No.: US 7,237,565 B2
(45) Date of Patent: Jul. 3, 2007

(54) FLUID FEEDING APPARATUS

(75) Inventors: Akira Hioki, Tokyo (JP); Satoshi Nakagawa, Ibaraki (JP); Akimasa Yajima, Tokyo (JP)

(73) Assignees: Adeka Engineering & Construction Co., Ltd, Tokyo (JP); Asahi Denka Co., Ltd, Tokyo (JP)

( * ) Notice: Subject to any disclaimer, the term of this patent is extended or adjusted under 35 U.S.C. 154(b) by 400 days.

(21) Appl. No.: 10/958,623

(22) Filed: Oct. 6, 2004

(65) Prior Publication Data
US 2005/0087135 A1 Apr. 28, 2005

(30) Foreign Application Priority Data
Oct. 8, 2003 (JP) .............................. 2003-349933
Aug. 20, 2004 (JP) .............................. 2004-241464

(51) Int. Cl.
G05D 7/00 (2006.01)
(52) U.S. Cl. ................... 137/240; 134/166 C
(58) Field of Classification Search ................ 137/240; 134/166 C
See application file for complete search history.

(56) References Cited

U.S. PATENT DOCUMENTS 5,727,589 A * 3/1998 Yokogi ....................... 137/240

6,857,447 B2 * 2/2005 Olander et al. ............. 137/240
6,953,047 B2 * 10/2005 Birtcher et al. ............. 137/240

FOREIGN PATENT DOCUMENTS

| JP | 6-244120 | 9/1994 |
|----|----------|--------|
| JP | 2001-108199 | 4/2001 |
| JP | 2002-343719 | 11/2002 |

* cited by examiner

Primary Examiner—Kevin Lee
(74) Attorney, Agent, or Firm—Young & Thompson

(57) ABSTRACT

A fluid feeding apparatus capable of excluding the outer environmental influences in feeding a fluid susceptible to contamination, decomposition or denaturation on contact with the outer environment. The includes comprises at least one liquid source container, a cleaning and/or diluting liquid container, a waste liquid collection container, an inert gas feed pipe A, an inert gas feed pipe B, an evacuation pipe connecting to a vacuum source, and a fluid feed pipe for introducing the fluid to a process. The source container has two pipes. The first pipe has valves arranged therein at positions nearer to and farther from the source container, respectively. The second pipe has two valves arranged therein at positions nearer to and farther from the container, respectively. The path between the valves 1 and 4 and the path between the valves 2 and 5 are connected via a connecting pipe C having a valve 3.

2 Claims, 12 Drawing Sheets

Fig. 2

FLUID FEEDING APPARATUS

BACKGROUND OF THE INVENTION

1. Field of the Invention

This invention relates to an apparatus for feeding, in fluid form, a compound or composition source which is susceptible to contamination, decomposition or denaturation on contact with the outer environment such as the atmosphere or light. More particularly, it relates to a raw material feeding apparatus capable of protecting the raw material against influences of the outer environment through cleaning and drying operations.

2. Description of the Related Art

Raw materials used in chemical vapor deposition (CVD) or atomic layer deposition (ALD) processes, which are called precursors, are reactive with water, oxygen, carbon dioxide or light, including silicon compounds, phosphorus compounds, boron compounds, metal compounds, and mixtures thereof. Such a raw material easily produces a solid phase deposit in pipes and valves on contact with the outer environment when the container of the raw material is attached or detached. The solid phase deposit influences vapor delivery and vapor phase growth reaction or adversely affects semiconductor thin film quality. A solid phase deposit of highly reactive materials such as alkyl metal compounds can ignite or explode. In analysis processes, such as liquid chromatography and gas chromatography, if a substance under analysis undergoes the outer environmental influences markedly, accurate analysis is not expected.

In the above-exemplified processes for production or analysis dealing with a fluid form source susceptible to contamination, decomposition or denaturation on contact with the outer environment, it has been demanded to establish a method of preventing the source from generating a decomposition or reaction product harmful to the process or a method of completely removing the decomposition or reaction product.

To address the problem, the following techniques have been proposed. JP-A-2001-108199 discloses a method in which a container for raw material delivery is used with a piping and valving configuration designed to enable purging any raw material remaining in the system with a fluid. JP-A-6-244120 also proposes a raw material feed system with a piping and valving configuration designed to enable purging and evacuation of the system. JP-A-2002-343719 discloses a feed system comprising a raw material container, a cleaning fluid container, and a container for a used cleaning fluid, the piping of which is easily purged and evacuated. These related techniques, however, do not bring about satisfactory solutions to the outstanding problem.

SUMMARY OF THE INVENTION

An object of the present invention is to provide a fluid feeding apparatus capable of excluding the outer environmental influences in feeding a fluid susceptible to contamination, decomposition or denaturation on contact with the outer environment.

As a result of extensive investigations, the present inventors have found that the above object is accomplished by a fluid feeding apparatus comprising at least one source container, a container for a cleaning and/or diluting liquid, and a collection container for a waste liquid and having pipes and valves located at specific positions. The present invention has thus been completed based on this finding.

The fluid feeding apparatus of the present invention comprises at least one source container for a source that is a fluid or capable of generating a fluid, at least one cleaning and/or diluting liquid container for a liquid for cleaning the inside of the feeding apparatus and/or diluting the source, at least one collection container for the liquid used for cleaning, at least one inert gas feed pipe A, at least one inert gas feed pipe B, at least one evacuation pipe connecting to a vacuum source, and at least one fluid feed pipe for delivering the fluid to a process. The source container has container pipes C-1 and C-2 both led into the inside thereof. The container pipe C-1 has a valve 1 and a valve 4 arranged therein at positions nearer to and farther from the source container, respectively. The container pipe C-2 has valves 2 and 5 arranged therein at positions nearer to and farther from the container, respectively. The path between the valves 1 and 4 and the path between the valves 2 and 5 are connected via a connecting pipe C having a valve 3. The cleaning and/or diluting liquid container has container pipes S-1 and S-2 both led into the inside thereof. The container pipe S-1 has a valve 12, and the container pipe S-2 has a valve 13. The container pipes S-1 and S-2 are connected to each other at positions farther from the container than the valves 12 and 13, respectively, via a connecting pipe S having a valve 14. The collection container has container pipes W-1 and W-2 both led into the inside thereof. The container pipe W-1 has a valve 17, and the container pipe W-2 has a valve 18. The container pipes W-1 and W-2 are connected to each other at positions farther from the container than the valves 17 and 18, respectively, via a connecting pipe W having a valve 19. The inert gas feed pipe A has a valve 15 and is connected to the container pipe S-1 via a joint S-1. The evacuation pipe has a valve 21 and is connected to the container pipe W-2 via a joint W-2. The inert gas feed pipe B is connected to the valve 4 via a joint C-1. The inert gas feed pipe B has valves 6 and 9 at positioned nearer to and farther from the joint C-1, respectively. The fluid feed pipe is connected to the valve 5 via a joint C-2. The fluid feed pipe has valves 7 and 10 arranged therein at positions nearer to and farther from the joint C-2, respectively. The valve 13 and the valve 17 are connected via a joint S-2 nearer to the container pipe S-2, through an S-W line, and via a joint W-1 nearer to the container pipe W-1 in this order. The S-W line has valves 16, 22, and 20 arranged therein in the order of from the nearest to the farthest from the joint S-2. The path of the S-W line between the valves 16 and 22 and the path of the inert gas feed pipe B between the valves 6 and 9 are connected via a connecting pipe C-S having a valve 8. The path of the S-W line between the valves 20 and 22 and the path of the fluid feed pipe between the valves 7 and 10 are connected via a connecting pipe C-W having a valve 11.

The present invention provides a fluid feeding apparatus capable of excluding the outer environmental influences in delivering a fluid susceptible to contamination, decomposition or denaturation on contact with the outer environment.

BRIEF DESCRIPTION OF THE DRAWINGS

FIG. 2 is a flow chart illustrating a configuration of the fluid feeding apparatus of the invention which has two source feed lines.

No./Constituent part

Figure 1:
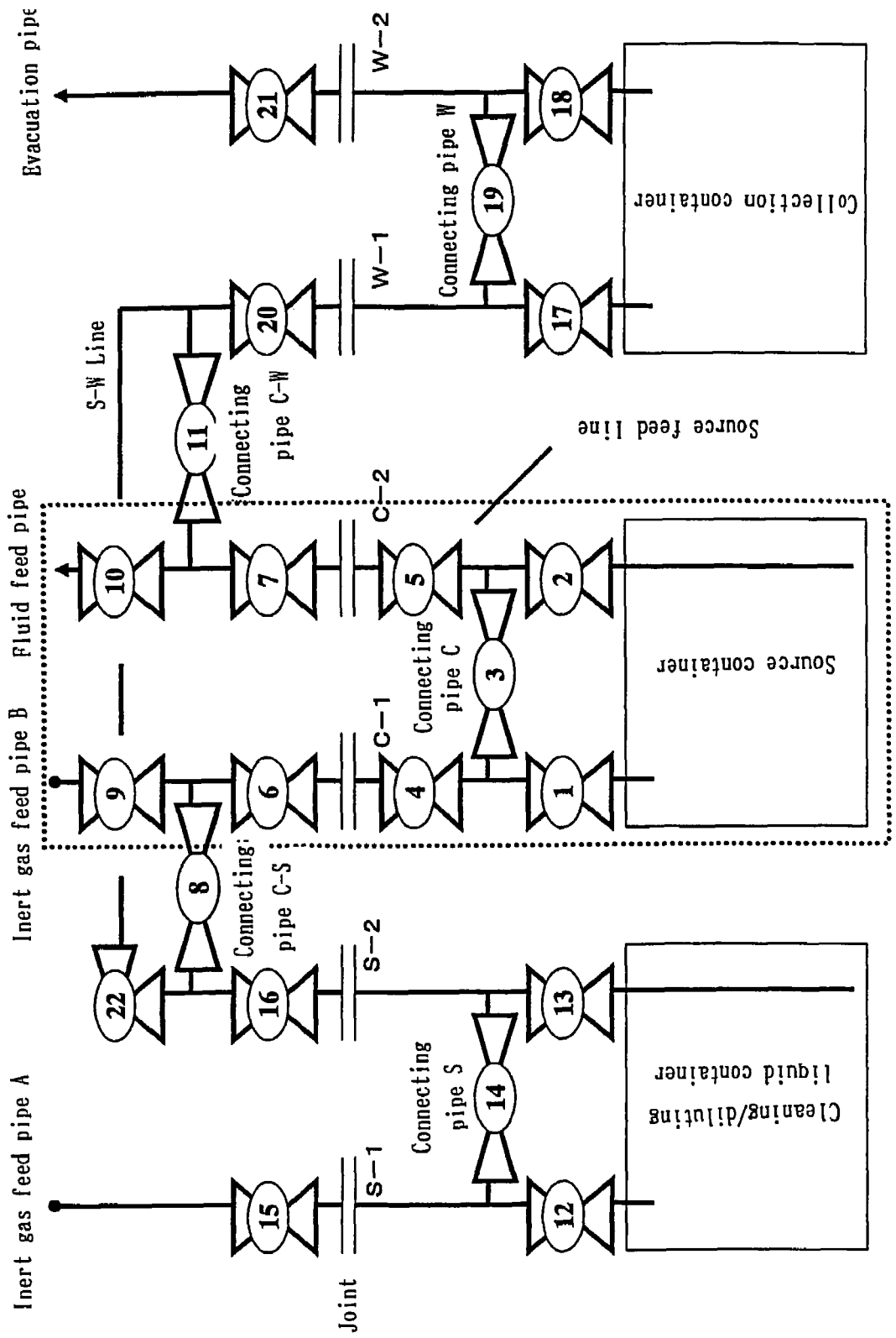
FIG. 1 is a flow chart illustrating a configuration of the fluid feeding apparatus of the invention which has one source feed line.

1/Block valve 1 (valves 12, 13 and 14)
2/Block valve 2 (valves 15 and 16)
3/Block valve 3 (valves 1, 2, 3, 4, and 5)
4/Block valve 4 (valves 6 and 7)
5/Block valve 5 (valves 1', 2', 3', 4', and 5')
6/Block valve 6 (valves 6' and 7')
7/Block valve 7 (valves 17, 18 and 19)
8/Block valve 8 (valves 20 and 21)
9/Mass flow meter 1
10/Mass flow meter 2
11/Mass flow meter 3
12/Gas treating agent
13/Pressure transmitter
14/Load cell
15/Flow control valve 1
16/Flow control valve 2
17/Flow control valve 3
18/Flow control valve 4
19/Double three-way valve 1 (valves 22 and 23)
20/Double three-way valve 2 (valves 8 and 9)
21/Double three-way valve 3 (valves 10 and 11)
22/Double three-way valve 4 (valves 8' and 9')
23/Double three-way valve 5 (valves 10' and 11')
24/Pressure gauge 1
25/Pressure gauge 2
26/Pressure gauge 3
27/Automatic valve 1
28/Automatic valve 2
29/Automatic valve 3
30/Automatic valve 4
31/Automatic valve 5
32/Automatic valve 6
33/Automatic valve 7
34/Automatic valve 8
35/Manual valve 1
36/Manual valve 2
37/Manual valve 3
38/Cleaning liquid container
39/Source container 1
40/Source container 2
41/Collection container

DETAILED DESCRIPTION OF THE INVENTION

The basic structure of the fluid feed apparatus of the invention is composed of the container units (including the source container, cleaning and/or diluting liquid container, and collection container), valve units, and joint units. The apparatus may have additional piping members, such as connecting pipes and linking pipes, disposed between the basic units for adjusting the distance between units. The apparatus may have two or more source containers, two or more cleaning and/or diluting liquid containers, and two or more collection containers. The apparatus of the invention which has the simplest structure, i.e., having one source container, one cleaning and/or diluting liquid container, and one collection container is diagrammatically represented in FIG. 1. The apparatus shown in FIG. 1 is for feeding liquid as a fluid.

Figure 2:
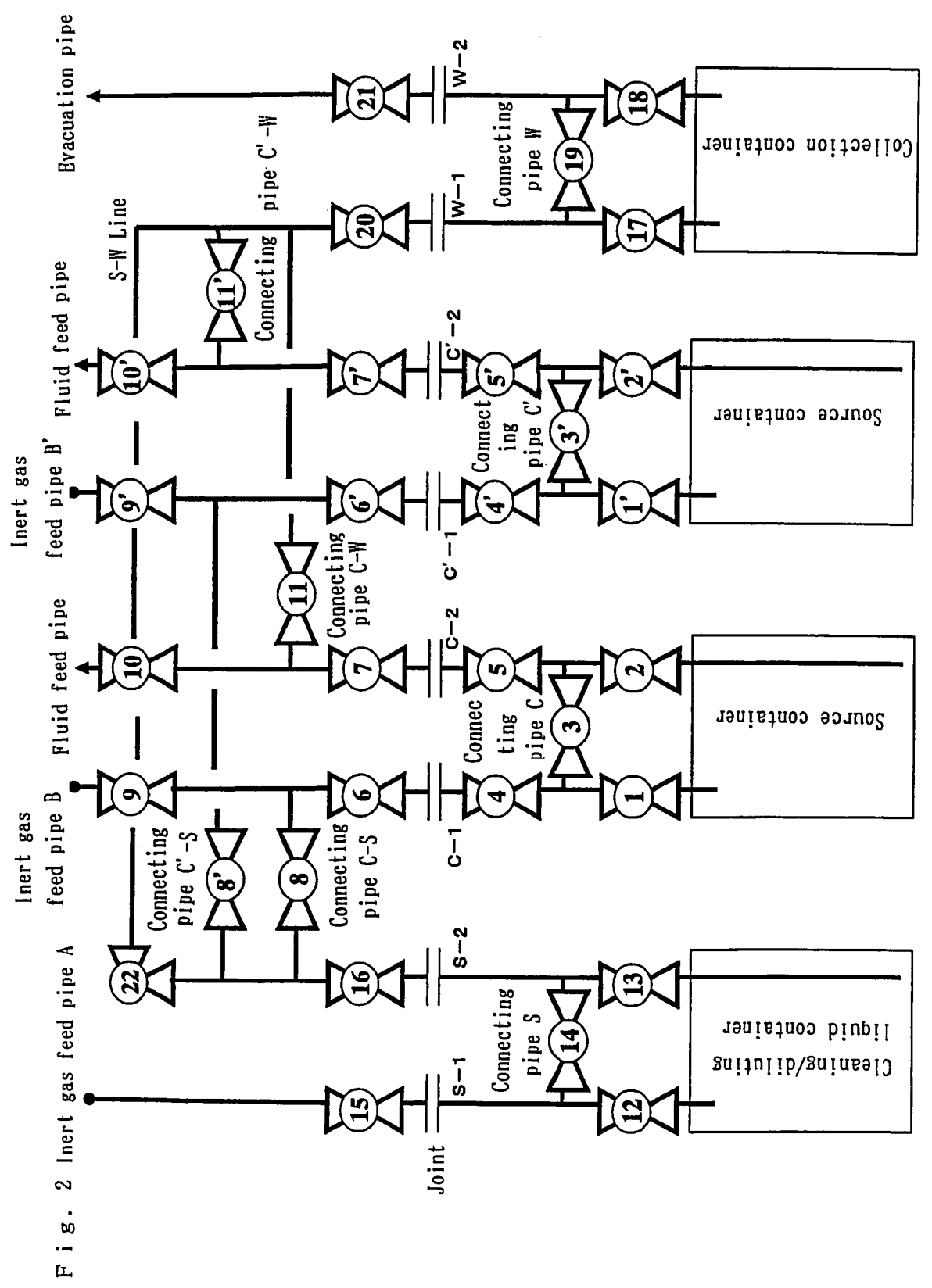

When the apparatus has two or more containers of a kind, as many lines as the containers are disposed in parallel, each of the lines including one of the containers and associated piping and valving. Taking an apparatus having two or more source containers for instance, two source feed lines, each represented by the line surrounded by the dotted line in FIG. 1, are arranged in parallel, which is diagrammatically illustrated in FIG. 2.

According to necessity, the fluid feed apparatus can have additional piping and valving members in its configuration, such as valves, branching pipes, by-pass pipes, and drain pipes, and members for process control or maintenance, such as a pressure gauge, a pressure transducer, a pressure controller, a vacuum controller, a residual amount measuring instrument, a leak sensor, an ejector, a mass flow controller (MFC) or a mass flow meter (MFM), a filter, and a flow controller for a gas purifier. The fluid feed apparatus may further have a heater and a heat controller for heating the system partly or wholly to increase the inside cleanness.

The heater can be installed to heat, for example, the S-W line, the connecting pipe C-W, or the valves 6, 7, 8, 9, 10, 11, 15, 16, 20, and 22. The heating temperature is set freely according to the material of the apparatus and the fluid to be heated but usually ranges from 30° to 300° C., preferably 50° to 150° C.

Each of the containers may have an auxiliary port serving for the maintenance of the container, such as a fill port or an exhaust port, and may be equipped with a pressure gauge, a level meter, a residual amount measuring instrument, etc. In order to protect a vacuum pump (vacuum source) at the downstream end of the evacuation pipe, it is advisable to put in an absorbent or adsorbent for trapping the source material or the cleaning and/or diluting liquid (e.g., a solvent) upstream the vacuum pump. Useful absorbents or adsorbents include activated clay, active alumina, natural or synthetic zeolite, molecular sieves, and activated carbon.

The members making up the apparatus, such as the containers, valves, joints, and pipes should be made of materials that shut off the outer environmental factors causative of contamination, decomposition or denaturation of the fluid and are inert to the fluid.

Such materials include synthetic resins, such as fluororesins (e.g., Teflon), silicones, polyolefins (e.g., polyethylene and polypropylene), polyamides (e.g., nylon), polyesters (e.g., polyethylene terephthalate), polyurethanes, and polyvinyl chloride; metal or metal alloys, such as austenitic stainless steels (e.g., SUS 316, 316L, 304, 304L, 317, and 317L), ferritic stainless steels (e.g., SUS 405, 410, and 430, and TP 409), duplex stainless steels (e.g., SUS 329), nickel alloys (e.g., Hastelloy), titanium, and aluminum; glasses including common glass and quartz glass; and ceramics, such as alumina, titania, zirconia, tantalum nitride, silicon nitride, and titanium nitride. These materials can be used either individually or as a combination thereof. The inner surface of the members may be coated with an inert material such as Teflon or glass, which depends on the material or the desired precision.

In CVD or ALD applications, the members are preferably made of stainless steel, which is resistant to high degrees of vacuum and suited to maintain cleanness. In order to prevent particle generation, metal leaching, and release of impurities such as water from the members, it is preferred that the surface of the members that is to be brought into contact with a fluid be finished by buffing, electrolytic polishing or high-precision polishing exemplified by electrochemical buffing (ECB) or mechanochemical polishing (MCP) technologies that combine chemical polishing with electrolytic or mechanical polishing, followed by precision cleaning, followed by thorough drying. If desired, the surface may be subjected to a secondary cleaning treatment, such as ozone passivation, oxygen/heat passivation or fluorine passivation.

Valves that can be used in CVD or ALD applications include plastic diaphragm valves, all-metal diaphragm valves, bellows valves, flow control valves, needle valves, ball valves, angle valves, butterfly valves, and gate valves. A plurality of valves may be connected or stacked into a monoblock valve or a stack valve. The valves may be air-driven or electricity-driven and controlled manually or automatically.

Stainless steels, such as SUS 316L, AOD- or VOD-processed single-melt or VIM- or VAR-processed double-melt materials, are suited for piping in CVD or ALD applications. Clean pipes whose inner surface has at least the cleanness of BE (bright annealed) pipes, preferably EP (electropolished) pipes or higher cleanness are used. In applications requiring high anticorrosion, the inner surface of the pipes can be passivated by oxidation or fluorination, if necessary. Connection between pipes or between a pipe and a fitting is preferably conducted by automatic butt-welding in a clean atmosphere.

Connection systems for the joints and connections of valving and piping with fittings in CVD and ALD applications include NW, KW, ICF, ISO, swagelock, VCR, UJR, CVC, MCG, UPG, Super JSK, and VTF. For applications to the parts that are to come into contact with a source (fluid), a cleaning liquid and an inert gas, it is preferred to use connectors or fittings that hardly generate particles when clamped and minimize the dead space, such as VCR, UJR, CVC, MCG, UPG, and Super JSK. In connecting two mono-block valves, a planar sealing system conforming to SEMI 2787, such as AG gasket connection or NT gasket connection, can be used in addition to the above-enumerated connection system.

The fluid that can be fed by the fluid feeding apparatus is gas or liquid, which may exist in the form of solid, liquid or gas in the source container. Where the source in the source container is solid, it is converted into a fluid by liquefaction or vaporization. In CVD or ALD applications, the fluid supplied from the apparatus through the fluid feed pipe may be delivered directly to a CVD or ALD chamber as a raw material of thin film formation or once transferred to a refill tank (buffer tank).

The fluids fed by the fluid feeding apparatus in CVD or ALD applications include silicon compounds, phosphorus compounds, boron compounds, metal compounds, and mixtures or solutions thereof. Metal atoms of the metal compounds include the Group 1 elements, e.g., lithium, sodium, potassium, rubidium, and cesium; the Group 2 elements, e.g., berylium, magnesium, calcium, strontium, and barium; the Group 3 elements, e.g., scandium, yttrium, lanthanides (i.e., La, Ce, Pr, Nd, Pm, Sm, Eu, Gd, Th, Dy, Ho, Er, Tm, Yb, and Lu), and actinoid elements; the Group 4 elements, e.g., titanium, zirconium, and hafnium; the Group 5 elements, e.g., vanadium, niobium, and tantalum; the Group 6 elements, e.g., chromium, molybdenum, and tungsten; the Group 7 elements, e.g., manganese, technetium, and rhenium; the Group 8 elements, e.g., iron, ruthenium, and osmium; the Group 9 elements, e.g., cobalt, rhodium, and iridium; the Group 10 elements, e.g., nickel, palladium, and platinum; the Group 11 elements, e.g., copper, silver, and gold; the Group 12 elements, e.g., zinc, cadmium, and mercury; the Group 13 elements, e.g., aluminum, gallium, indium, and thallium; the Group 14 elements, e.g., germanium, tin, and lead; the Group 15 elements, e.g., arsenic, antimony, and bismuth; and the Group 16 elements, e.g., polonium.

The silicon compounds, phosphorus compounds, boron compounds, and metal compounds are not particularly limited as long as they are volatile enough for CVD or ALD applications. Ligands that are bonded to silicon, phosphorus, boron or the above-recited metal atom to make the compounds include halogens, e.g., chlorine, bromine and iodine; alkanes, e.g., methane, ethane, propane, 2-propane, and butane; monoalkylamines, e.g. monomethylamine, monoethylamine, and monobutylamine; dialkylamines, e.g., dimethylamine, diethylamine, ethylmethylamine, dipropylamine, diisopropylamine, dibutylamine, and di-tert-butylamine; silylamines, e.g., trimethylsilylamine and triethylsilylamine; alkanimines, e.g., methanimine, ethanimine, propaniminne, 2-propanimine, butanimine, 2-butanimine, isobutanimine, tert-butanimine, pantanimine, and tert-pentanimine; cyclopentadienes, e.g., cyclopentadiene, methylcyclopentadiene, ethylcyclopentadiene, propylcyclopentadiene, isopropylcyclopentadiene, butylcyclopentadiene, tert-butylcyclopentadiene, dimethylcyclopentadiene, and pentamethylcyclopentadiene; monoalcohols, e.g., methanol, ethanol, propanol, 2-propanol, butanol, 2-butanol, tert-butyl alcohol, isobutyl alcohol, amyl alcohol, isoamyl alcohol, tert-amyl alcohol, 2-methoxyethyl alcohol, 1,1-dimethyl-2-methoxyethyl alcohol, 2-(N,N'-dimethyl)ethyl alcohol, and 1,1-dimethyl-2-(N,N'-dimethyl)ethyl alcohol; diols, e.g., 1,3-propanediol, 2-methyl-1,3-propanediol, 1,3-butanediol, 1,3-pentanediol, 2,4-pentanediol, and 2-methyl-2,4-pentanediol; β-diketones; and P-keto esters, e.g., methyl acetoacetate, ethyl acetoacetate, butyl acetoacetate, and 2-methoxyethyl acetoacetate. The coordinate compounds can have one or more kinds of these ligands coordinated to the center metal. Polynuclear compounds having two or more kinds of metal elements per molecule, such as double alkoxides, are also useful.

The metal compounds containing the Group 2 element include those represented by formula:

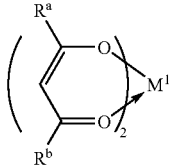 

wherein $M^1$ represents Mg, Ca, St or Ba; $R^a$ and $R^b$ each represent a halogen-substituted or unsubstituted alkyl group having 1 to 20 carbon atoms which may contain an oxygen atom in the carbon chain; and $R^j$ represents an alkyl group having 1 to 4 carbon atoms.

The metal compounds containing the Group 3 element include those represented by the following formulae:

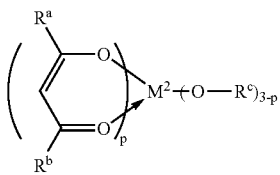 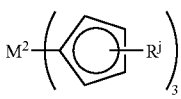

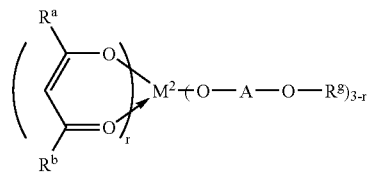

wherein $M^2$ represents Sc, Y, La, Ce, Pr, Nd, Pm, Sm, Eu, Gd, Tb, Dy, Ho, Er, Tm, Yb or Lu; $R^a$, $R^b$, and $R^j$ are as defined above; $R^c$ represents an alkyl group having 1 to 8 carbon atoms; $R^g$ represents an alkyl group having 1 to 4 carbon atoms, A represents a straight-chain or branched alkanediyl group having 2 to 8 carbon atoms; p represents an integer of 0 to 3; and r represents an integer of 0 to 2.

The metal compounds containing the Group 4 element include those represented by the following formulae:

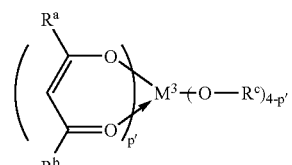

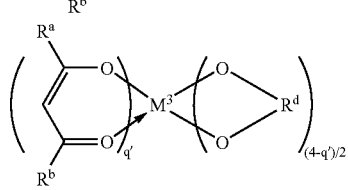

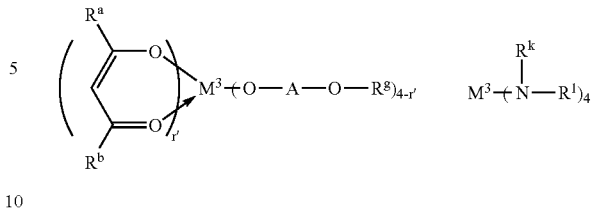

wherein $M^3$ represents Ti, Zr or Hf; $R^a$, $R^b$, $R^c$, $R^g$, and A are as defined above; Rd represents a straight-chain or branched alkylene group having 2 to 18 carbon atoms; $R^k$ and $R^1$ each represent an alkyl group having 1 to 4 carbon atoms; p' represents an integer of 0 to 4; q' represents 0 or 2; and r' represents an integer of 0 to 3.

The metal compounds containing the Group 5 element include those represented by the following formulae:

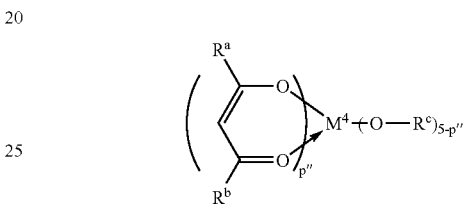

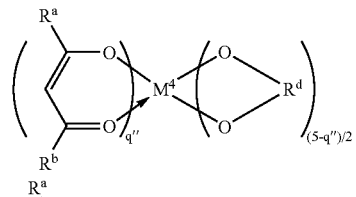

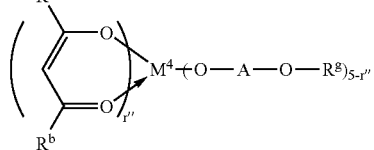

wherein $M^4$ represents V, Nb or Ta; $R^a$, $R^b$, $R^c$, $R^d$, $R^g$, and A are as defined above; p" represents an integer of 0 to 5; q" represents 1 or 3; and r" represents an integer of 0 to 4.

The compounds containing aluminum include those represented by the following formulae:

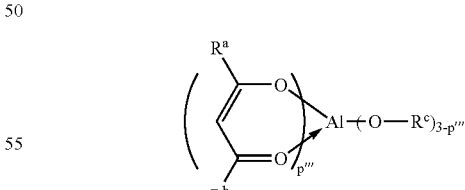

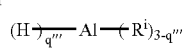

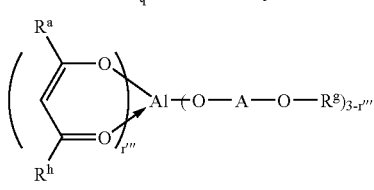

wherein $R^a$, $R^c$, $R^g$, and A are as defined above; $R^h$ represents a halogen-substituted or unsubstituted alkyl group having 1 to 20 carbon atoms which may contain an oxygen atom in the carbon chain thereof or a halogen-substituted or unsubstituted alkoxy group having 1 to 8 carbon atoms; $R^i$ represents an alkyl group having 1 to 4 carbon atoms; p''' represents an integer of 0 to 3; q''' represents an integer of 0 to 2; and r''' represents an integer of 0 to 2.

The bismuth compounds include triaryl bismuth compounds, such as triphenyl bismuth, tri(o-methylphenyl) bismuth, tri(m-methylphenyl) bismuth, and tri(p-methylphenyl) bismuth; trialkyl bismuth compounds, such as trimethyl bismuth; β-diketone complexes, such as tris(2,2,6,6-tetramethylheptane-3,5-dionato)bismuth; cyclopentadienyl complexes, such as tris(cyclopentadienyl)bismuth and tris(methylcyclopentadienyl)bismuth; lower alcohol alkoxides, such as tri(tert-butoxy) bismuth, tri(tert-pentoxy) bismuth, and triethoxy bismuth; and ether alkoxides, such as tris(1,1-dimethyl-2-methoxyethoxy)bismuth.

The lead compounds include alkyl-substituted β-diketonates, such as bis(acetylacetonato)lead, bis(hexane-2,4-dionato)lead, bis(5-methylhexane-2,4-dionato)lead, bis(heptane-2,4-dionato)lead, bis(heptane-3,5-dionato)lead, bis(2-methylheptane-3,5-dionato)lead, bis(5-methylheptane-2,4-dionato)lead, bis(6-methylheptane-2,4-dionato)lead, bis(2,2-dimethylheptane-3,5-dionato)lead, bis(2,6-dimethylheptane-3,5-dionato)lead, bis(2,2,6-trimethylheptane-3,5-dionato)lead, bis(2,2,6,6-tetramethylheptane-3,5-dionato)lead, bis(octane-2,4-dionato)lead, bis(2,2,6-trimethyloctane-3,5-dionato)lead, bis(2,6-dimethyloctane-3,5-dionato)lead, bis(2,2,6,6-tetramethyloctane-3,5-dionato)lead, bis(3-methyloctane-3,5-dionato)lead, bis(2,7-dimethyloctane-3,5-dionato)lead, bis(5-ethylnonane-2,4-dionato)lead, bis(2-methyl-6-ethyldecane-3,5-dionato)lead, and bis(6-ethyl-2,2-dimethyldecane-3,5-dionato)lead; fluoroalkyl β-diketonates, such as bis(1,1,1-trifluoropentane-2,4-dionato)lead, bis(1,1,1-trifluoro-5,5-dimethylhexane-2,4-dionato)lead, bis(1,1,1,5,5,5-hexafluoropentane-2,4-dionato)lead, and bis(1,3-diperfluorohexylpropane-1,3-dionato)lead; and ether-substituted β-diketonates, such as bis(1,1,5,5-tetramethyl-1-methoxyhexane-2,4-dionato)lead, bis(2,2,6,6-tetramethyl-1-methoxyheptane-3,5-dionato)lead, and bis(2,2,6,6-tetramethyl-1-(2-methoxyethoxy)heptane-3,5-dionato)lead.

In the above-illustrated formulae, the halogen-substituted or unsubstituted alkyl group having 1 to 20 carbon atoms which may contain an oxygen atom in the carbon chain as represented by $R^a$, $R^b$, and $R^h$ includes methyl, ethyl, propyl, isopropyl, butyl, sec-butyl, tert-butyl, isobutyl, amyl, isoamyl, sec-amyl, tert-amyl, hexyl, 1-ethylpentyl, cyclohexyl, 1-methylcyclohexyl, heptyl, isoheptyl, tert-heptyl, n-octyl, isooctyl, tert-octyl, 2-ethylhexyl, trifluoromethyl, perfluorohexyl, 2-methoxyethyl, 2-ethoxyethyl, 2-butoxyethyl, 2-(2-methoxyethoxy)ethyl, 1-methoxy-1,1-dimethylmethyl, 2-methoxy-1,1-dimethylethyl, 2-ethoxy-1,1-dimethylethyl, 2-isopropoxy-1,1-dimethylethyl, 2-butoxy-1,1-dimethylethyl, and 2-(2-methoxyethoxy)-1,1-dimethylethyl. The alkyl group having 1 to 8 carbon atoms as represented by $R^c$ includes methyl, ethyl, propyl, isopropyl, butyl, sec-butyl, tert-butyl, isobutyl, amyl, isoamyl, sec-amyl, tert-amyl, hexyl, 1-ethylpentyl, cyclohexyl, 1-methylcyclohexyl, heptyl, isoheptyl, tert-heptyl, n-octyl, isooctyl, tert-octyl, and 2-ethylhexyl. The straight-chain or branched alkylene group having 2 to 18 carbon atoms as represented by $R_d$ is one derived from glycols, including 1,2-ethanediol, 1,2-propanediol, 1,3-propanediol, 1,3-butanediol, 2,4-hexanediol, 2,2-dimethyl-1,3-propanediol, 2,2-diethyl-1,3-propanediol, 2,2-diethyl-1,3-butanediol, 2-ethyl-2-butyl-1,3-propanediol, 2,4-pentanediol, 2-methyl-1,3-propanediol, and 1-methyl-2,4-pentanediol. The alkyl group having 1 to 4 carbon atoms represented by $R^g$, $R^j$, and $R^i$ includes those represented by $R^c$ which have 1 to 4 carbon atoms. The alkanediyl group having 2 to 8 carbon atoms represented by A includes ethylene, propylene, butylene, $-C(CH_3)_2-CH_2-$, $-CH(CH_3)-CH_2-$, $-CH_2-CH(CH_3)-$, $-CH(CH_3)-CH(CH_3)-$, $-CH(CH_3)-C_2H_4-$, $-CH_2-CH(CH_3)-CH_2-$, $-C_2H_4-CH(CH_3)-$, $-C(C_2H_5)_2-CH_2-$, $-CH(C_2H_5)-CH_2-$, $-C(CH_3)(C_2H_5)-CH_2-$, and $-C(C_2H_5)_2-C_2H_4-$.

The solvent that can be used to dissolve the source compound includes alcohols, e.g., methanol, ethanol, 2-propanol, and n-butanol; acetic esters, such as ethyl acetate, butyl acetate, and methoxyethyl acetate; ether alcohols, such as ethylene glycol monomethyl ether, ethylene glycol monoethyl ether, and ethylene glycol monobutyl ether; ethers, such as furan, pyran, tetrahydrofuran, tetrahydropyran, ethylene glycol dimethyl ether, diethylene glycol dimethyl ether, triethylene glycol dimethyl ether, and dibutyl ether; ketones, such as acetone, ethyl methyl ketone, methyl butyl ketone, methyl isobutyl ketone, ethyl butyl ketone, dipropyl ketone, diisobutyl ketone, methyl amyl ketone, cyclohexanone, and methylcyclohexanone; hydrocarbons, such as hexane, cyclohexane, methylcyclohexane, ethylcyclohexane, butylcyclohexane, dimethylcyclohexane, heptane, octane, benzene, toluene, and xylene; cyano-containing hydrocarbons, such as acetonitrile, 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; aliphatic polyamines, such as diethylamine, triethylamine, dibutylamine, tributylamine, ethylenediamine, N,N'-tetramethylethylenediamine, N,N'-tetramethylpropylenediamine, diethylenetriamine, triethylenetetramine, tetraethylenepentamine, pentaethylenehexamine, 1,1,4,7,7-pentamethyldiethylenetriamine, and 1,1,4,7,10,10-hexamethyltriethylenetetramine; and nitrogen-containing heterocyclic compounds, such as pyrrole, imidazole, pyrazole, pyridine, lutidine, pyrazine, pyrimidine, pyrrolidone, imidazolidine, pyrazolidine, piperidine, piperazine, and morpholine. These solvents can be used either individually or as a mixture of two or more thereof, which depends on the solubility of the solute, the relation between the boiling point or ignition point of the solvent and the temperature of using the solution.

The cleaning liquid that can be used in the CVD and ALD applications includes the above-recited solvents and halogen-containing solvents, such as chloroform, dichloroethyl ether, dichloropropane, trichloroethylene, trichloroethane, and trichlorobenzene.

The method of using the fluid feeding apparatus of the present invention is described below, taking, for instance, feeding a liquid source through a single feed line.

Figure 3:
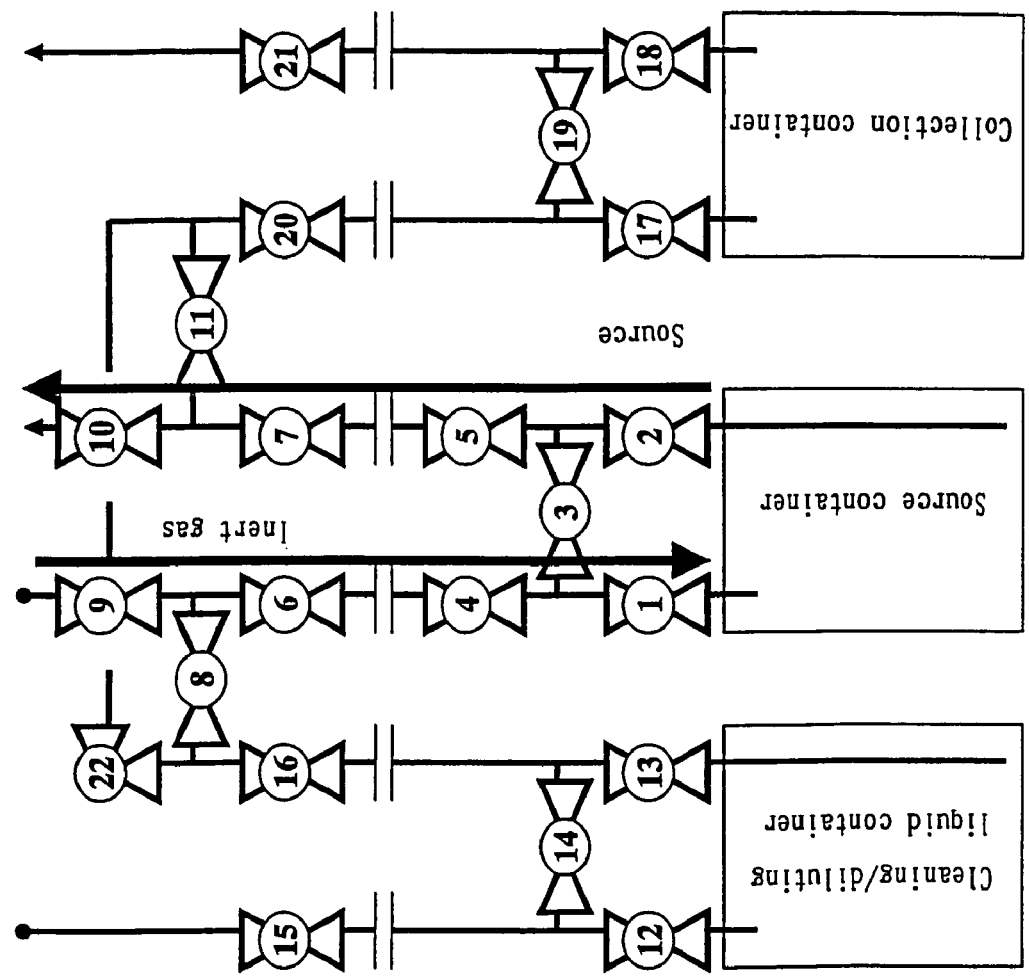
FIG. 3 is a flow chart showing the flow path for a source in the step of source feeding in the fluid feeding apparatus of FIG. 1.

The path of the source in the apparatus while fed is shown in FIG. 3. While the source is fed, the cleaning line and the waste collection line are closed to operate the source feed line alone. An inert gas is introduced into the source container through the inert gas feed pipe B, and the fluid is delivered from the container to a process through the source feed pipe.

Cleaning of the feed line necessitated by exchange of source containers is carried out as follows. Before the source container is removed, the collection container is evacuated, and the source remaining in the feed line is drawn into the collection container along the path shown in FIG. 4.

Figure 5:
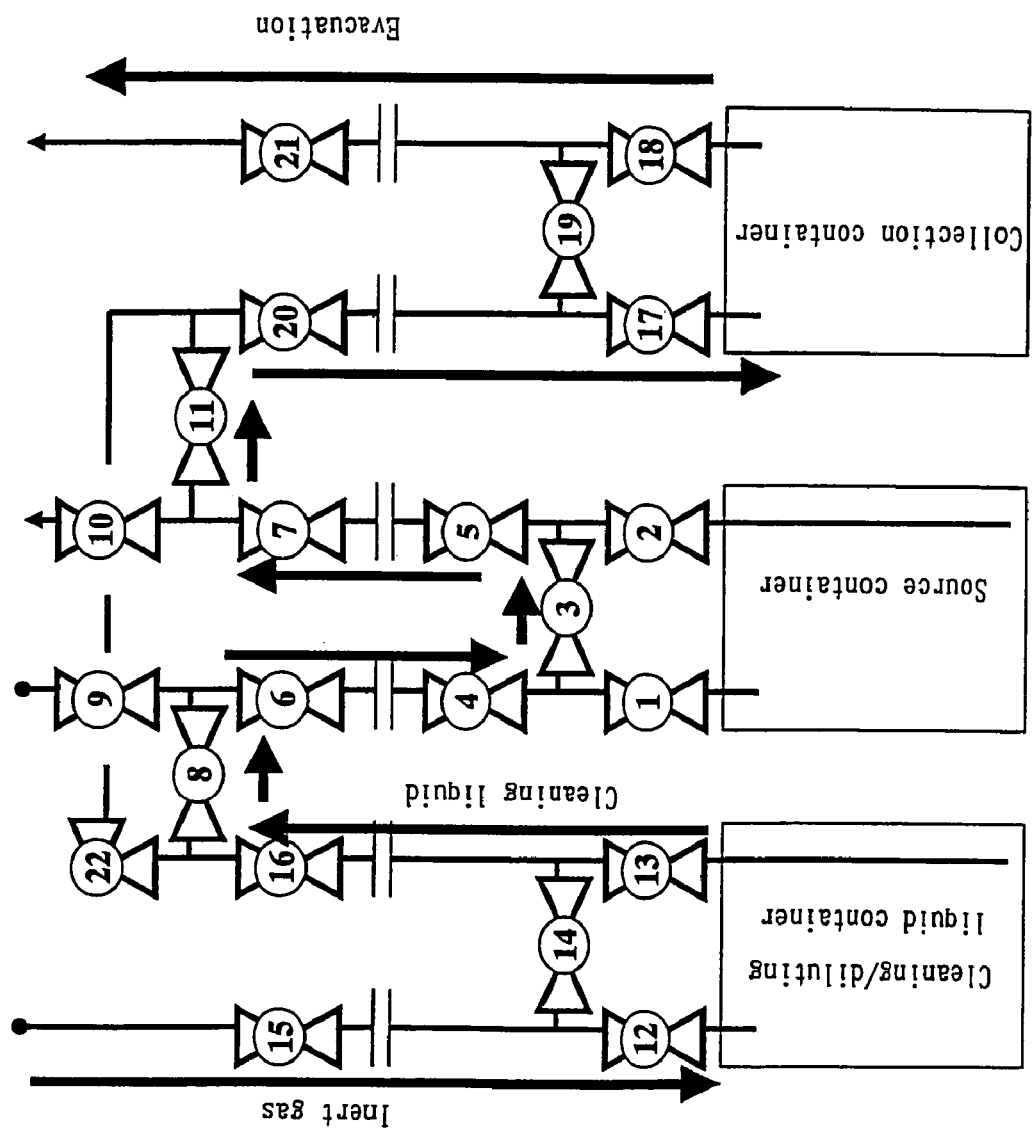
FIG. 5 is a flow chart indicating the flow path of a cleaning liquid in the step of cleaning in the fluid feeding apparatus of FIG. 1.

The cleaning liquid container is pressurized by an inert gas while the collection container is evacuated so that a cleaning liquid is made to flow through the system as shown in FIG. 5. The cleaning liquid thus cleans the paths and enters the collection container.

Figure 6:
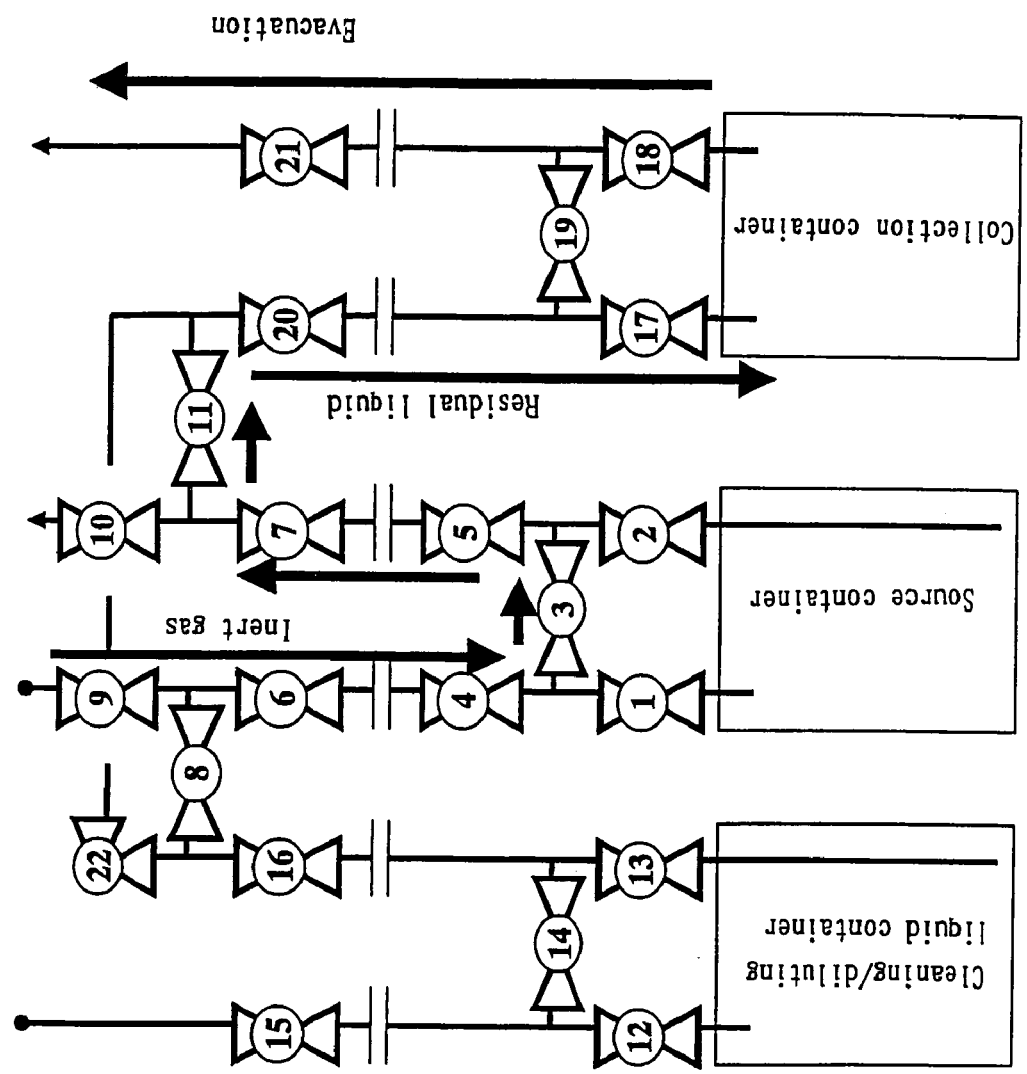
FIG. 6 is a flow chart showing the flow path of an inert gas in the step of gas purging in the fluid feeding apparatus of FIG. 1.

The cleaning liquid feed line is closed. Gas is then fed through the inert gas feed pipe B to bring any residual liquid to the collection container as shown in FIG. 6. Thereafter, the valve 17 is closed, and the valve 19 is opened to conduct inert gas purging, during which the collection container is maintained evacuated.

Figure 7:
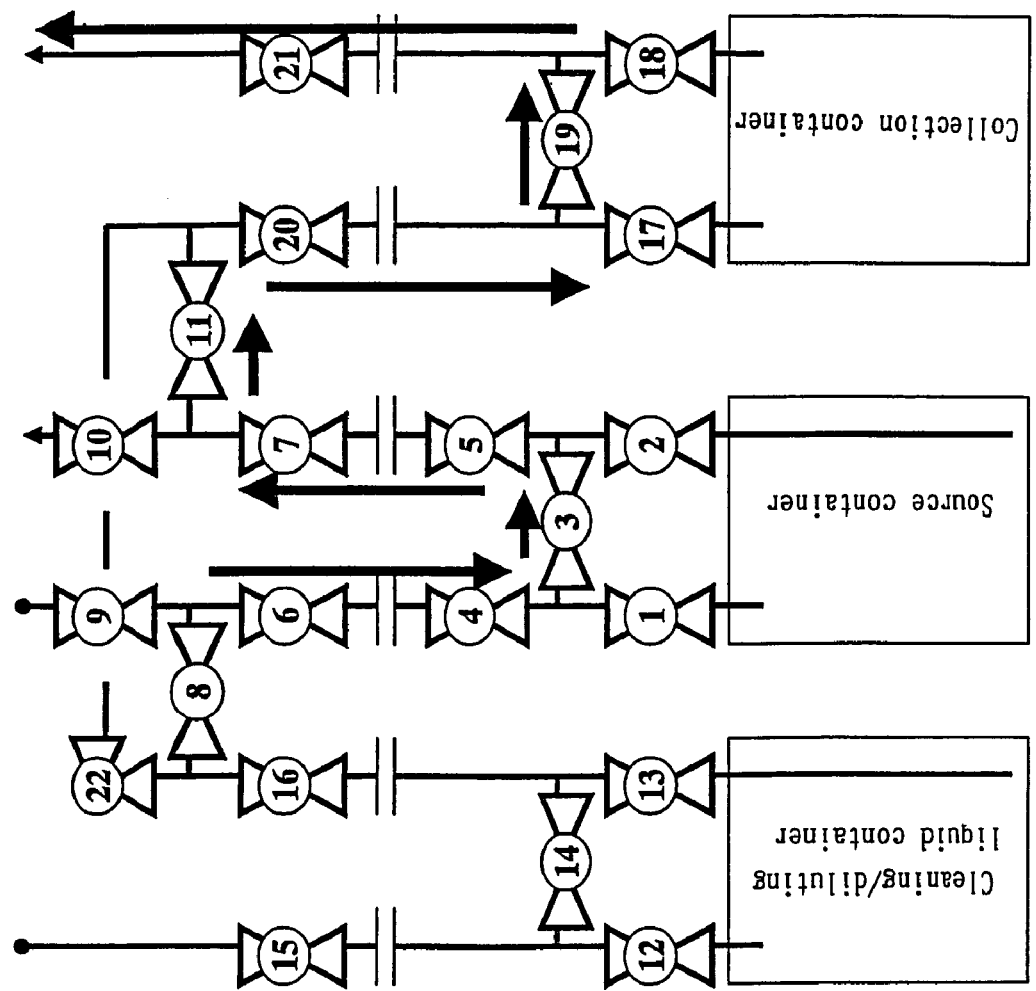
FIG. 7 is a flow chart showing the path for an inert gas for expelling the air after exchange of source containers in the fluid feeding apparatus of FIG. 1.

The valves 6 and 7 are closed, the joints C-1 and C-2 are disconnected, and the source container is exchanged for another one. After the exchange, the path indicated in FIG. 7 is evacuated of the air. Where the source material is highly reactive with the air or easily absorbs an air component, the containers may be exchanged with the valves 6 and 7 kept open while purging the path of from valves 9 to 6 and the path from the valves 15, through the valves 14, 16, 22 and 11, to the valve 7 with the inert gas.

Figure 8:
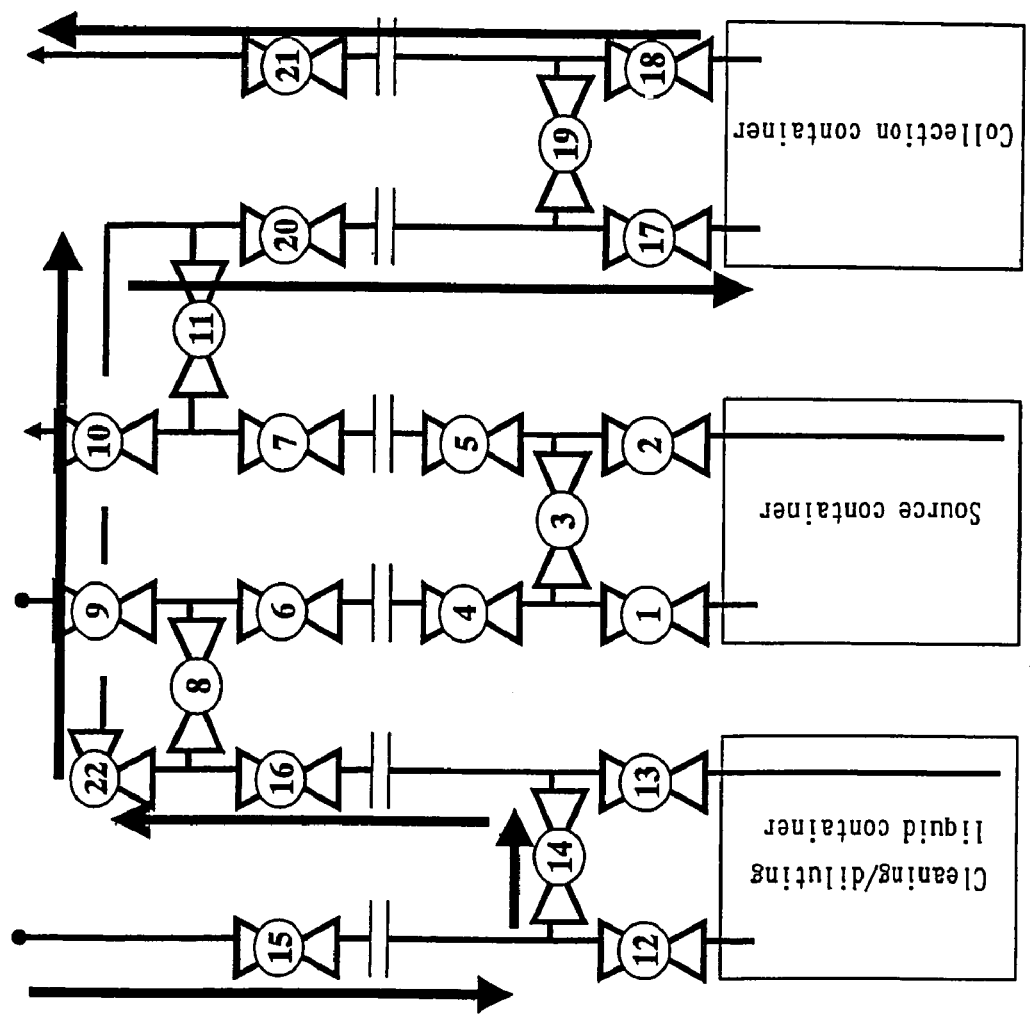
FIG. 8 is a flow chart illustrating the flow path for an inert gas for removing the residual cleaning liquid before exchange of cleaning liquid containers and the flow path for removing the air after the exchange of cleaning liquid containers.

The operation for exchanging cleaning liquid containers is shown in FIG. 8. The liquid remaining in the path indicated in FIG. 8 is transferred into the collection container by pressurizing with an inert gas and evacuating the collection container. Then, the valve 17 is closed, and the valve 19 is opened, thereby the path is purged with the inert gas. After these two steps are repeated at least once, the valve 17 is closed, the valve 19 is opened, and the system is evacuated of the air.

Figure 4:
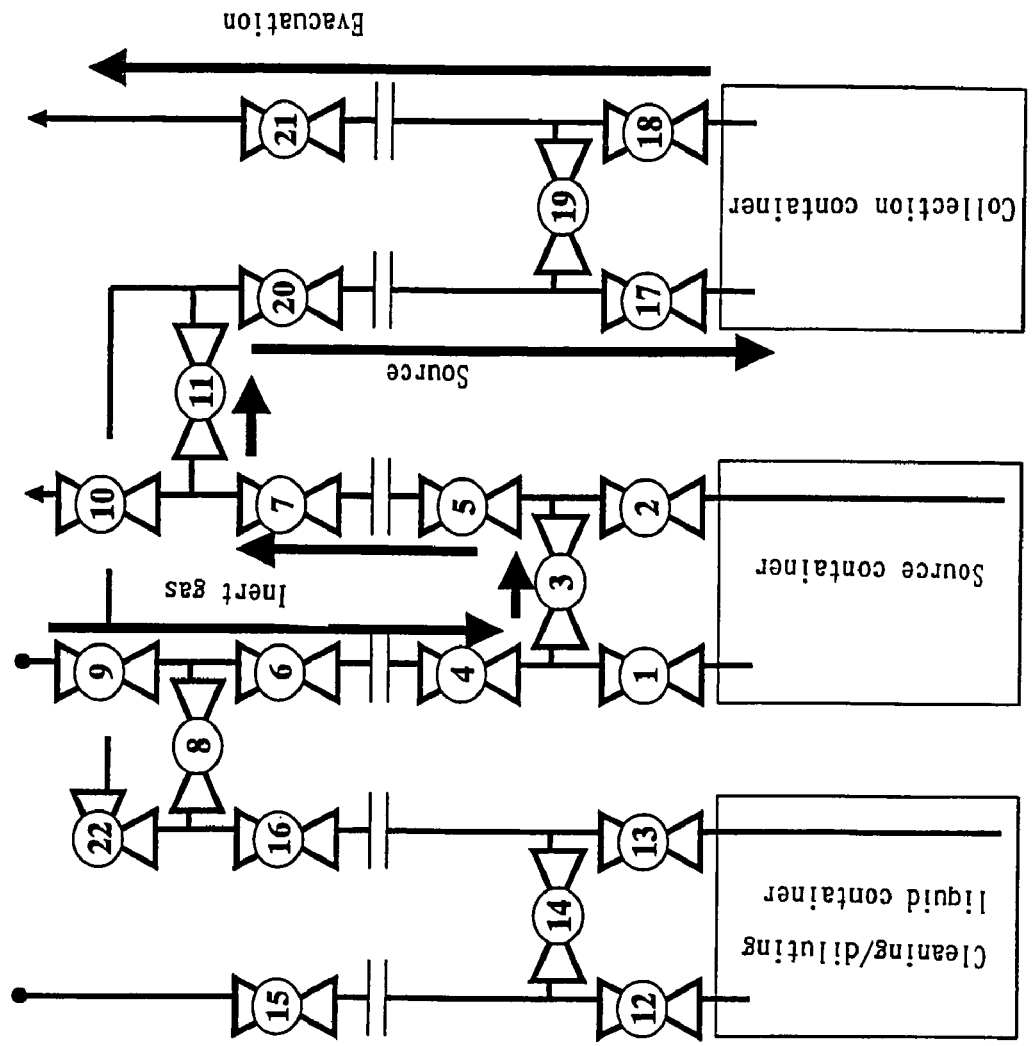
FIG. 4 is a flow chart showing the path for collecting the source in the step of cleaning in the fluid feeding apparatus of FIG. 1.

If necessary, the following additional cleaning step may be carried out after the source in the path is transferred to the collection container as shown in FIG. 4 and before the cleaning liquid is made to flow in the path shown in FIG. 5.

Figure 9:
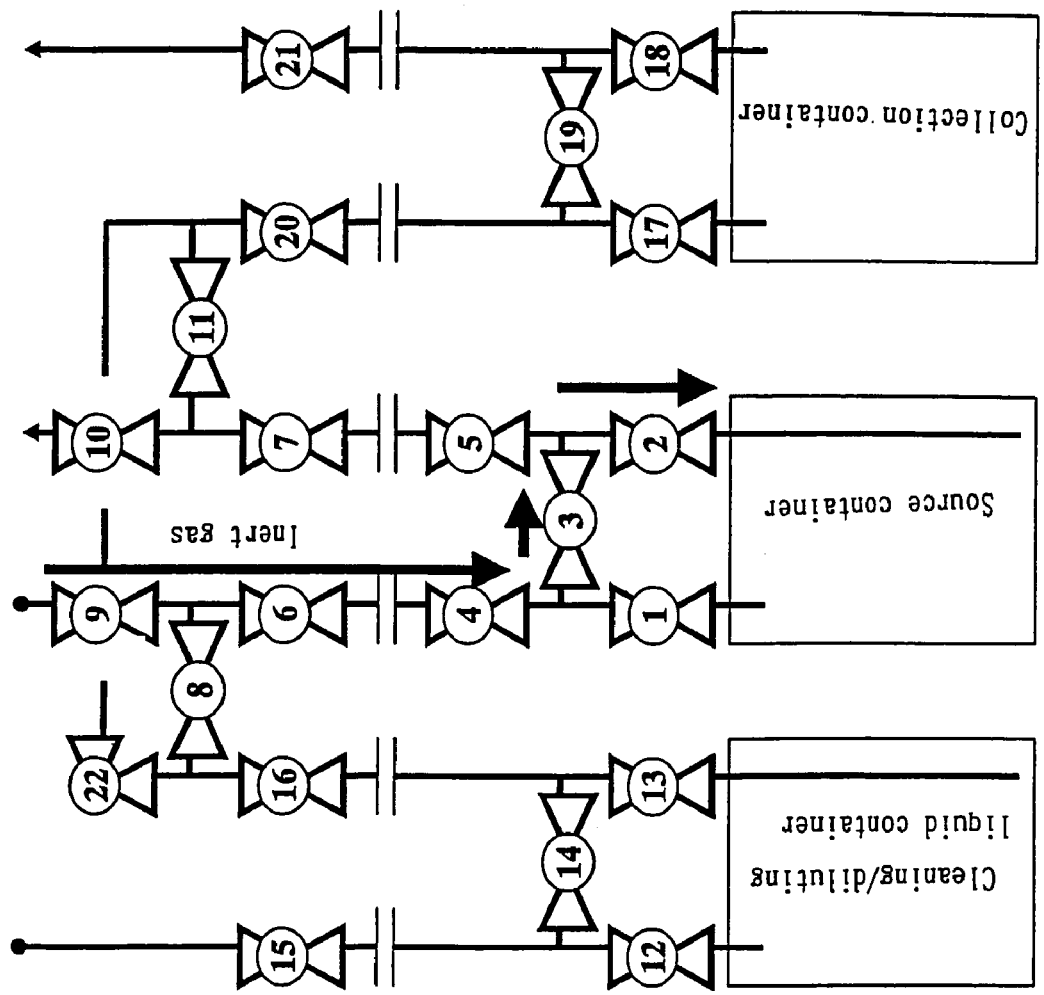
FIG. 9 is a flow chart illustrating the flow of an inert gas in the step of additional cleaning in the fluid feeding apparatus of FIG. 1.

The source container is evacuated, and the inert gas is fed to draw the remaining source in the path into the source container through the route shown in FIG. 9.

Figure 10:
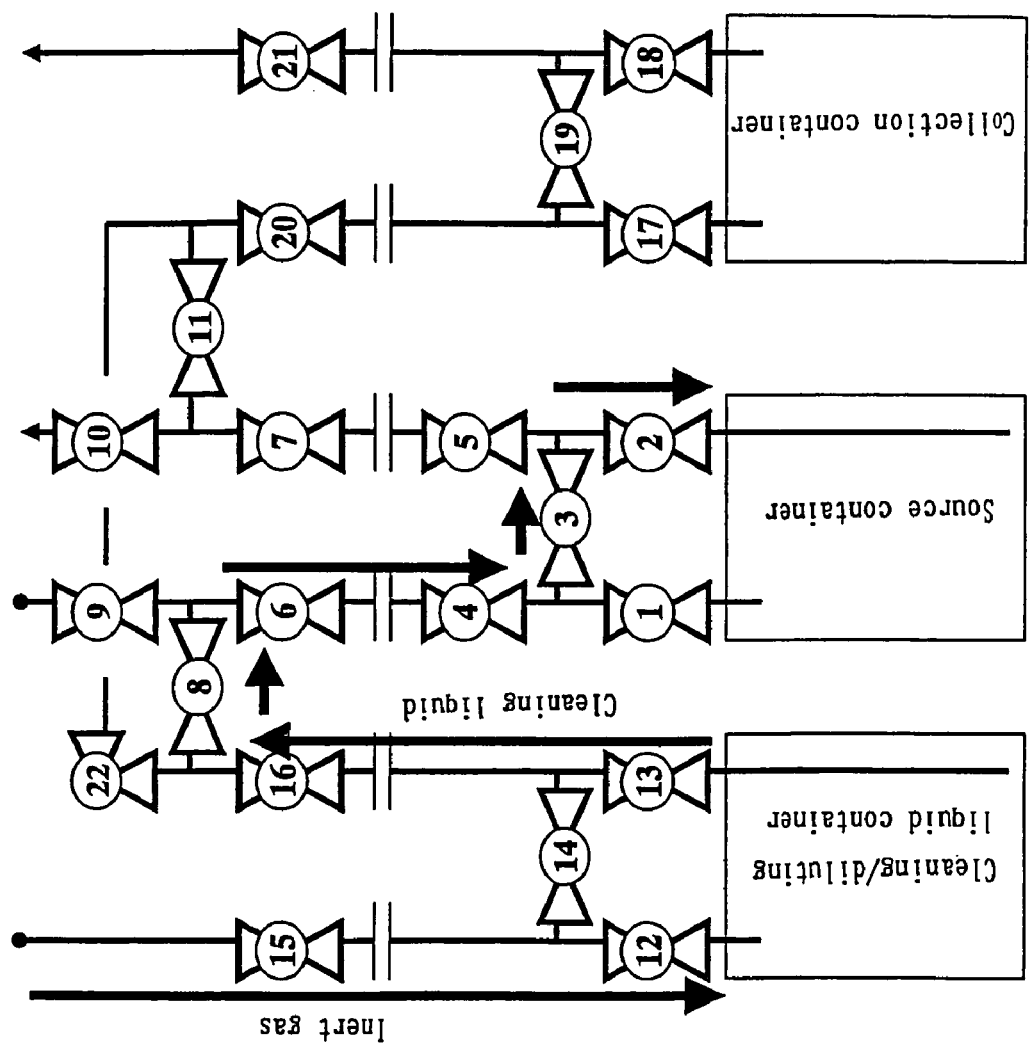
FIG. 10 is a flow chart showing the flow path of a cleaning liquid in the step of additional cleaning in the fluid feeding apparatus of FIG. 1.

The cleaning liquid is made to flow along the path indicated in FIG. 10. The amount of the cleaning liquid to be used for the cleaning is 2 to 50 times, preferably 5 to 10 times, the amount of the liquid source remaining in the source container.

Figure 11:
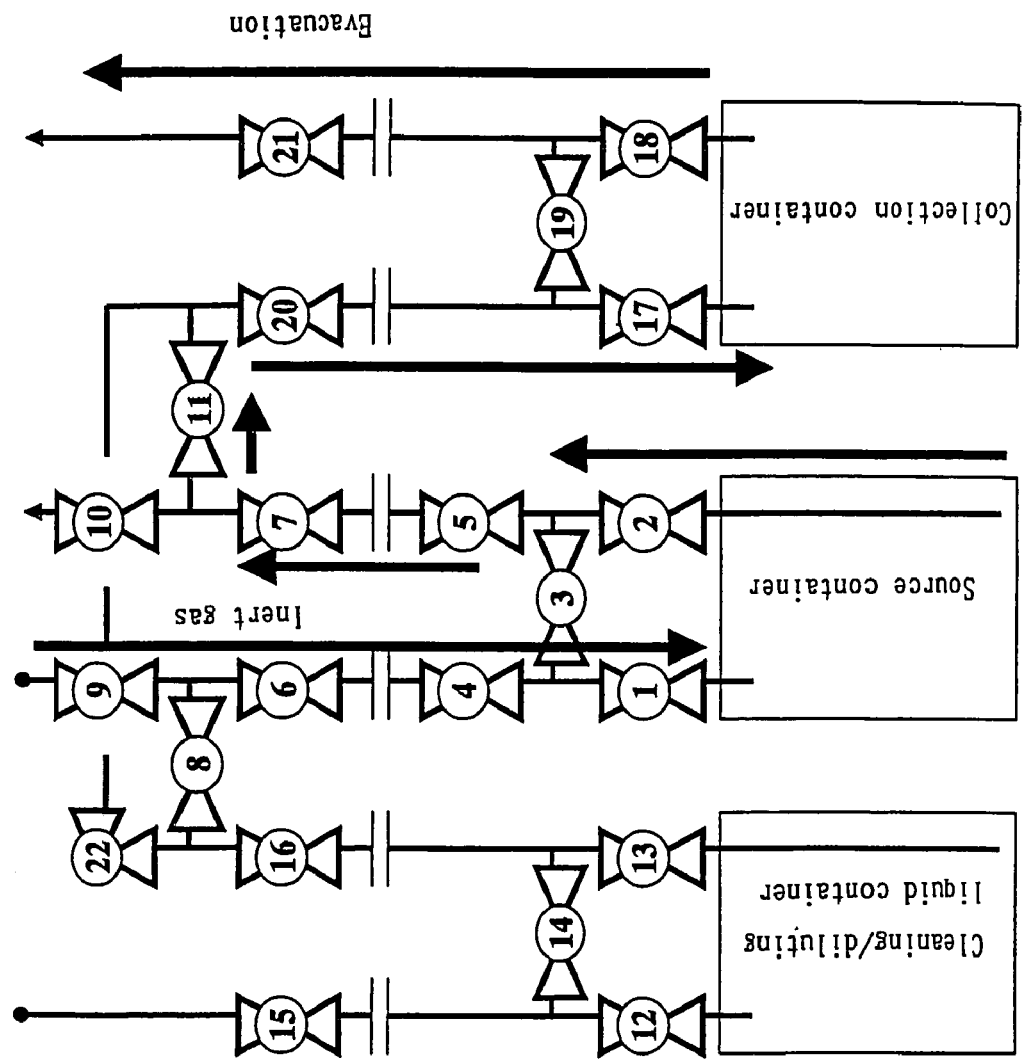
FIG. 11 is a flow chart showing the flow path for transferring the mixed liquid of the source container to the collection container in the step of additional cleaning in the fluid feeding apparatus of FIG. 1.

The mixed liquid in the source container is transferred to the collection container through the path shown in FIG. 11 by pressurizing the source container with the inert gas and evacuating the collection container.

The above-described additional cleaning step is effective to increase the cleanness between the valves 2, 5, and 3 controlling the passage in the container pipe C-2 and the connecting pipe C.

The additional cleaning step is also applicable to source dilution. For example, the source in the source container can be diluted with a diluent by replacing the cleaning liquid container with a diluent container containing the diluent and performing the same operation as in the above-mentioned additional cleaning step. The diluting step is useful when a pyrophoric source, classified into class 3 of hazardous material under the Fire Service Law, Japan, such as trimethylaluminum should be rendered non-pyrophoric by dilution with an appropriate solvent.

The fluid feeding apparatus according to the present invention is effective where the fluid to be fed is susceptible to the outer environmental influences. The apparatus finds applications in delivering a precursor in CVD and ALD processes, an etchant in a dry or wet etching process, a sample in a high precision analysis process, a drug for medication, or food and drink.

The present invention will now be illustrated in greater detail with reference to Example and Evaluation Examples, but it should be understood that the invention is not construed as being limited thereto.

EXAMPLE

Figure 12:
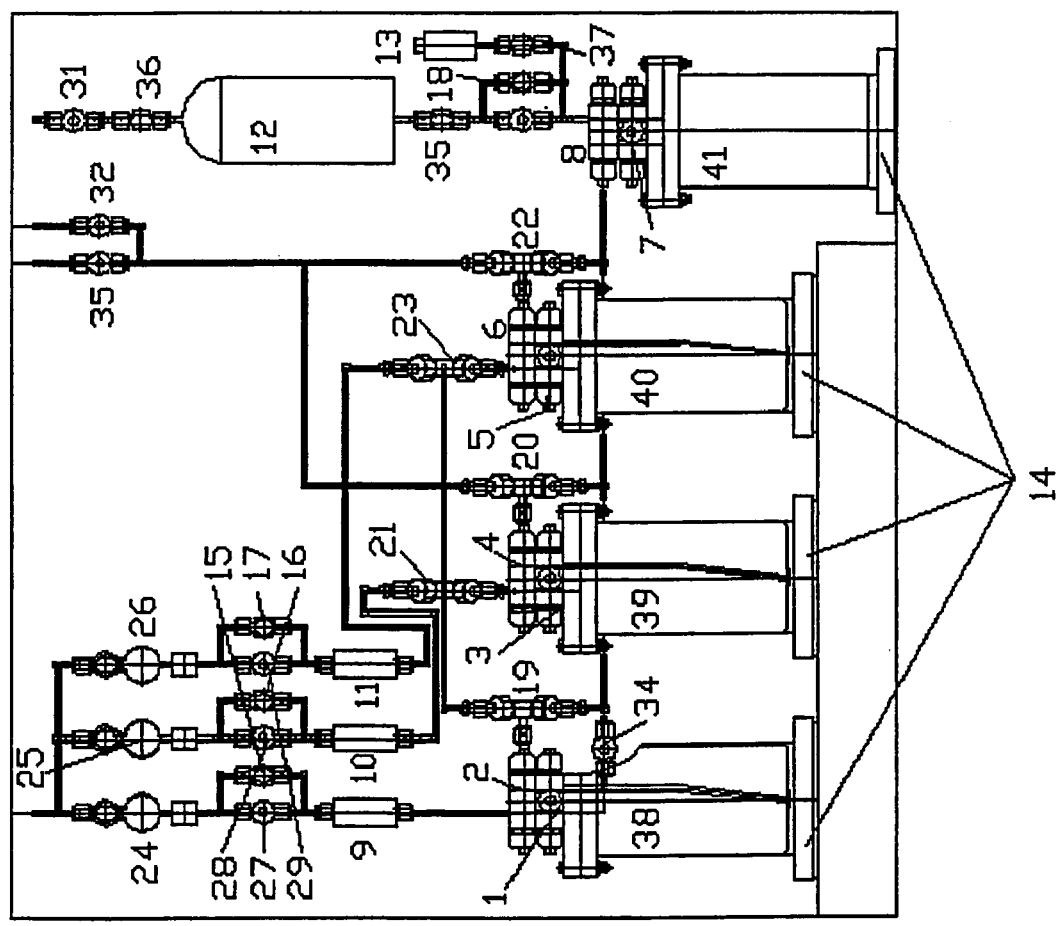
FIG. 12 schematically illustrates an example of the fluid feeding apparatus of the invention, in which two sources are fed through the respective lines. The constituent parts indicated by the numerical references in FIG. 12 are as follows.

A concrete configuration of the fluid feeding apparatus according to the invention is illustrated in FIG. 12. This configuration is designed for application to a multi-source CVD or ALD process using two sources.

Evaluation Example 1

The apparatus shown in FIG. 1, which is designed to feed a single source, was operated as follows using tetra(tert-butyl) hafnium as a source and hexane as a cleaning liquid. The cleaning liquid (hexane) was made to flow at a rate of 300 g/min for 20 seconds in each cleaning operation. The cleanness of the source feed line was evaluated by the hafnium concentration of the cleaning liquid collected in the collection container determined by ICP-mass spectrometry.

(1) Source Feeding Step

The cleaning line (valves 15, 12, 14, 13, 16, 22, and 8) and the collection line (valves 11, 20, 17, 19, 18, and 21) were closed. Valves 9, 6, 4, and 1 were opened, and argon gas (inert gas) was introduced into the source container through the thus opened path. At the same time, valves 2, 5, 7, and 10 were opened to feed the source through the thus opened feed path. During the feeding, the valve 3 was kept closed.

(2) Cleaning Step

With the valves 15, 12, 14, 13, 16, 22, and 8 closed, the valves 18 and 21 were opened to evacuate the collection container. The valves 1, 2, and 10 were closed, and the valves 17, 20, 11, 7, 5, 3, 4, 6, and 9 were opened to draw the fluid remaining in the piping into the collection container by introducing the inert gas through the opened path. Then, the valve 9 was closed, and the valves 15, 12, 13, 16, and 8 were opened, with the valve 14 closed. The cleaning liquid container was pressurized with the inert gas, while the collection container was evacuated, whereby the cleaning liquid was made to flow and clean the path.

(3) Purging Step

The valves 15, 12, 14, 13, 16, 22, and 8 were closed to close the cleaning liquid line. The collection container was evacuated through the valves 21 and 18. With the valves 1, 2, and 10 closed, the valves 17, 20, 11, 7, 5, 3, 4, 6, and 9 were opened, and the inert gas was fed from the inert gas feed pipe B to transfer the liquid remaining in the path to the collection container. The valve 19 was opened, and the valves 17 and 18 were closed to purge the path with the inert gas. The collection container was maintained at reduced pressure. The paths through which the residual liquid and the purging gas passed were heated to 80° C.

(4) Exchange of Containers

After the steps of cleaning followed by purging were repeated 10 times, the valves 4, 5, and 3 were closed. The valves 6 and 7 were opened, and the valves 14, 16, 22, 11, and 7 were also opened. The inert gas was introduced from the inert gas feed pipes B and A to purge the path of from the valve 9 through the valve 6 and the path of from the valve 15 and through the valves 14, 16, 22, 11, and 7 with the inert gas. While the paths were purged, the joints C-1 and C-2 were disconnected to exchange the source container for another one. After the container exchange, the paths exposed to the outer atmosphere were evacuated to expel the air from the paths. The cleaning liquid collected in the collection container was sampled for every cleaning operation to determine the hafnium concentration.

(5) Evaluation Results

| Collected Cleaning Liquid | Hafnium Concentration |
| --- | --- |
| 1st | 104 ppm |
| 3rd | 22 ppm |
| 5th | 4 ppm |
| 6th | 1 ppm |
| 10th | 0.2 ppm |

Evaluation Example 2

The steps from source feed to exchange of containers of Evaluation Example 1 were repeated 9 times. The fluid feeding apparatus was taken apart to see if any substance such as a decomposition product of the source was attached to the inner surface of the joints C-1 and C-2 and the valves 7 and 10 with the naked eye and a fiber scope. As a result, no deposit was observed.

Evaluation Example 3

The apparatus shown in FIG. 1, which is designed to feed a single source, was operated as follows using tetrakis (dimethylamino)hafnium as a source and hexane as a cleaning liquid. The cleaning liquid (hexane) was made to flow at a rate of 300 g/min for 20 seconds in each cleaning operation. The cleanness of the source feed line was evaluated by the hafnium concentration of the cleaning liquid collected in the collection container determined by ICP-mass spectrometry.

(1) Source Feeding Step

The source was fed through the source feed pipe according to the same procedures as in Evaluation Example 1.

(2) Cleaning Step

The valves 15, 12, 14, 13, 16, 22, and 8 were closed. The collection container was evacuated with the valves 21 and 18 open. The fluid remaining in the piping was drawn into the collection container by introducing the inert gas through opened valves 17, 20, 11, 7, 5, 3, 4, 6 and 9, with the valves 1, 2, and 10 closed. Then, the valves 4, 6, and 9 were closed, and the valve 1 was opened. After an elapse of a certain time, the valve 1 was closed. The valves 18, 17, 20, 11, 7, and 5 were closed, the valves 15, 12, 13, 16, 8, 6, 4, 3, and 2 were opened, and a predetermined amount of the cleaning liquid was made to flow into the source container. The valves 15, 12, 13, 16, 8, 6, 4, 3, and 2 were closed, the valves 9, 6, 4, 1, 18, 17, 20, 11, 7, 5, and 2 were opened, and the solution in the source container was transferred into the collection container. The valves 4, 6, and 9 were closed again, and the valve 1 was opened. After a certain time, the valve 1 was closed, the valves 18, 17, 20, 11, 7, and 5 were closed, the valves 15, 12, 13, 16, 8, 6, 4, 3, and 2 were opened. A small amount of the cleaning liquid was made to flow into the source container, followed by closing the valves 15, 12, 13, 16, 8, 6, 4, 3, and 2.

The valve 9 was closed, and the valves 15, 12, 13, 16, 8, 6, 4, 3, 5, 7, 11, 20, 17, and 18 were relieved. During this step, the cleaning liquid container was pressurized with the inert gas with the valve 14 closed, while the collection container was kept evacuated.

(3) Purging Step

Purging was carried out in the same manner as in Evaluation Example 1.

(4) Exchange of Containers

After the steps of cleaning followed by purging were repeated 10 times, the valves 4, 5, and 3 were closed. The valves 6 and 7 were relieved, and the path of from the valve 9 through the valve 6 and the path of from the valve 15 and through the valves 14, 16, 22, 11, and 7 were purged with the inert gas. During the purging, the joints C-1 and C-2 were disconnected to exchange the source container for another one. After the container exchange, the paths exposed to the outer atmosphere were evacuated to expel the air from the paths. The cleaning liquid collected in the collection container was sampled for every cleaning operation to determine the hafnium concentration.

(5) Evaluation Results

| Collected Cleaning Liquid | Hafnium Concentration |
| --- | --- |
| 1st | 93 ppm |
| 3rd | 20 ppm |
| 5th | 2 ppm |
| 6th | 0.4 ppm |
| 10th | 0.06 ppm |

Evaluation Example 4

The steps from source feed to exchange of containers of Evaluation Example 3 were repeated 9 times. The fluid feeding apparatus was taken apart to see if any substance such as a decomposition product of the source is attached to the inner surface of the joints C-1 and C-2 and the valves 7 and 10 with the naked eye and a fiber scope. As a result, no deposit was observed.

What is claimed is:

1. An apparatus for feeding a fluid to a process comprising at least one source container for a source that is a fluid or capable of generating a fluid, at least one cleaning and/or diluting liquid container for a liquid for cleaning the inside of the fluid feeding apparatus and/or diluting the source, at least one collection container for collecting the cleaning liquid used for cleaning, at least one inert gas feed pipe (A), at least one inert gas feed pipe (B), at least one evacuation pipe connecting to a vacuum source, and at least one fluid feed pipe for delivering the fluid to the process, the source container having container pipes (C-1) and (C-2) both led into the inside thereof, the container pipe (C-1) having a valve (1) and a valve (4) arranged therein at positions nearer to and farther from the source container, respectively, the container pipe (C-2) having a valve (2) and a valve (5) arranged therein at positions nearer to and farther from the source container, respectively, the path between the valves (1) and (4) and the path between the valves (2) and (5) being connected via a connecting pipe (C) having a valve (3);

the cleaning and/or diluting liquid container having container pipes (S-1) and (S-2) both led into the inside thereof, the container pipe (S-1) having a valve (12), the container pipe (S-2) having a valve (13), the container pipes (S-1) and (S-2) being connected at positions farther from the cleaning and/or diluting liquid container than the valves (12) and (13), respectively, via a connecting pipe (S) having a valve (14);

the collection container having container pipes (W-1) and (W-2) both led into the inside thereof, the container pipe (W-1) having a valve (17), the container pipe (W-2) having a valve (18), the container pipes (W-1) and (W-2) being connected at positions farther from the collection container than the valves (17) and (18), respectively, via a connecting pipe (W) having a valve (19);

the inert gas feed pipe (A) having a valve (15) and being connected to the container pipe (S-1) via a joint (S-1);

the evacuation pipe having a valve (21) and being connected to the container pipe (W-2) via a joint (W-2);

the inert gas feed pipe (B) being connected to the valve (4) via a joint (C-1) and having valves (6) and (9) arranged therein at positions nearer to and farther from the joint (C-1), respectively;

the fluid feed pipe being connected to the valve (5) via a joint (C-2) and having valves (7) and (10) arranged therein at positions nearer to and farther from the joint (C-2) respectively;

the valve (13) and the valve (17) being connected via a joint (S-2) nearer to the container pipe (S-2), through an S-W line, and via a joint (W-1) nearer to the container pipe (W-1) in this order, the S-W line having valves (16), (22), and (20) arranged therein in the order of from the nearest to the farthest from the joint (S-2);

the path between the valves (16) and (22) being connected to the path between the valves (6) and (9) via a connecting pipe (C-S) having a valve (8); and the path between the valves (22) and (20) being connected to the path between the valves (10) and (7) via a connecting pipe (C-W) having a valve (11).

2. An apparatus for feeding a fluid to a process comprising a first source container for a first source that is a fluid or capable of generating a fluid, a second source container for a second source that is a fluid or capable of generating a fluid, a cleaning and/or diluting liquid container for a liquid for cleaning the inside of the fluid feeding apparatus and/or diluting at least one of the first and the second sources, a collection container for collecting the cleaning liquid used for cleaning, an inert gas feed pipe (A), an inert gas feed pipe (B), an inert gas feed pipe (B'), an evacuation pipe connecting to a vacuum source, a first fluid feed pipe for delivering the fluid of the first source to the process, and a second fluid feed pipe for delivering the fluid of the second source to the process, the first source container having container pipes (C-1) and (C-2) both led into the inside thereof, the container pipe (C-1) having a valve (1) and a valve (4) arranged therein at positions nearer to and farther from the first source container, respectively, the container pipe (C-2) having a valve (2) and a valve (5) arranged therein at positions nearer to and farther from the first source container, respectively, the path between the valves (1) and (4) and the path between the valves (2) and (5) being connected via a connecting pipe (C) having a valve (3);

the second source container having container pipes (C'-1) and (C'-2) both led into the inside thereof, the container pipe (C'-1) having a valve (1') and a valve (4') arranged therein at positions nearer to and farther from the second source container, respectively, the container pipe (C'2) having a valve (2') and a valve (5') arranged therein at positions nearer to and farther from the second source container, respectively, the path between the valves (1') and (4') and the path between the valves (2') and (5') being connected via a connecting pipe (C') having a valve (3');

the cleaning and/or diluting liquid container having container pipes (S-1) and (S-2) both led into the inside thereof, the container pipe (S-1) having a valve (12), the container pipe (S-2) having a valve (13), the container pipes (S-1) and (S-2) being connected at positions farther from the cleaning and/or diluting liquid container than the valves (12) and (13), respectively, via a connecting pipe (S) having a valve (14);

the collection container having container pipes (W-1) and (W-2) both led into the inside thereof, the container pipe (W-1) having a valve (17), the container pipe (W-2) having a valve (18), the container pipes (W-1) and (W-2) being connected at positions farther from the collection container than the valves (17) and (18), respectively, via a connecting pipe (W) having a valve (19);

the inert gas feed pipe (A) having a valve (15) and being connected to the container pipe (S-1) via a joint (S-1);

the evacuation pipe having a valve (21) and being connected to the container pipe (W-2) via a joint (W-2);

the inert gas feed pipe (B) being connected to the valve (4) via a joint (C-1) and having valves (6) and (9) arranged therein at positions nearer to and farther from the joint (C-1), respectively;

the inert gas feed pipe (B') being connected to the valve (4') via a joint (C'-1) and having valves (6') and (9') arranged therein at positions nearer to and farther from the joint (C'-1), respectively;

the first fluid feed pipe being connected to the valve (5) via a joint (C-2) and having valves (7) and (10) arranged therein at positions nearer to and farther from the joint (C-2), respectively;

the second fluid feed pipe being connected to the valve (5') via a joint (C'-2) and having valves (7') and (10') arranged therein at positions nearer to and farther from the joint (C'-2), respectively;

the valve (13) and the valve (17) being connected via a joint (S-2) nearer to the container pipe (S-2), an S-W line, and a joint (W-1) nearer to the container pipe (W-1) in this order, the S-W line having valves (16), (22), and (20) arranged therein in the order of from the nearest to the farthest from the joint (S-2);

the path between the valves (16) and (22) being connected to the path between the valves (6) and (9) via a connecting pipe (C-S) having a valve (8);

the path between the valves (16) and (22) being connected to the path between the valves (9') and (6') via a connecting pipe (C'-S) having a valve (8');

the path between the valves (22) and (20) being connected to the path between the valves (10) and (7) via a connecting pipe (C-W) having a valve (11); and the path between the valves (22) and (20) being connected to the path between the values (10') and (7') via a connecting pipe (C'-W) having a valve (11').

* * * * *